United States Patent [19]

Weiske et al.

[11] 3,743,896

[45] July 3, 1973

[54] SEMICONDUCTOR COMPONENT STRUCTURE FOR GOOD THERMAL CONDUCTIVITY

[75] Inventors: Wolfgang Weiske; Herbert Vogt, both of Munich, Germany

[73] Assignee: Siemens Aktiengesellschaft, Berlin, Germany

[22] Filed: Mar. 27, 1972

[21] Appl. No.: 238,682

Related U.S. Application Data

[63] Continuation of Ser. No. 66,746, Aug. 25, 1970, abandoned.

[30] Foreign Application Priority Data

Sept. 2, 1969 Germany .................. P 19 44 515.9

[52] U.S. Cl. ....... 317/234 R, 317/234 E, 317/234 P, 317/234 A, 29/588

[51] Int. Cl. ............................ H01l 3/00, H01l 5/00

[58] Field of Search ........................ 317/234, 235, 1, 317/3, 3.1, 6, 11; 165/185; 29/588

[56] References Cited

UNITED STATES PATENTS

| | | | |
|---|---|---|---|
| 2,946,935 | 7/1960 | Finn | 317/234 |
| 3,441,813 | 4/1969 | Takatsuka et al. | 317/234 |
| 3,474,302 | 10/1969 | Blundell | 317/234 |
| 3,512,249 | 5/1970 | Lewis | 317/234 |

FOREIGN PATENTS OR APPLICATIONS

| | | | |
|---|---|---|---|
| 975,573 | 11/1964 | Great Britain | 317/234 |
| 2,002,396 | 2/1969 | France | 317/234 |

*Primary Examiner*—John W. Huckert
*Assistant Examiner*—Andrew J. James
*Attorney*—Arthur E. Wilfond, Herbert L. Lerner et al.

[57] ABSTRACT

The cover of a cup-shaped housing of electrically and thermally conductive material which encloses a semiconductor body in a gas-tight manner is supported in the housing in a manner whereby the surface of the cover farther from the semiconductor body is at least as high as the outer height dimension of the side wall of the housing. This permits good heat conductivity to an assembly part in a recess of which the housing is pressed, without adverse effect on the synthetic material of the cover.

1 Claim, 2 Drawing Figures

SEMICONDUCTOR COMPONENT STRUCTURE FOR GOOD THERMAL CONDUCTIVITY

Figure 1:
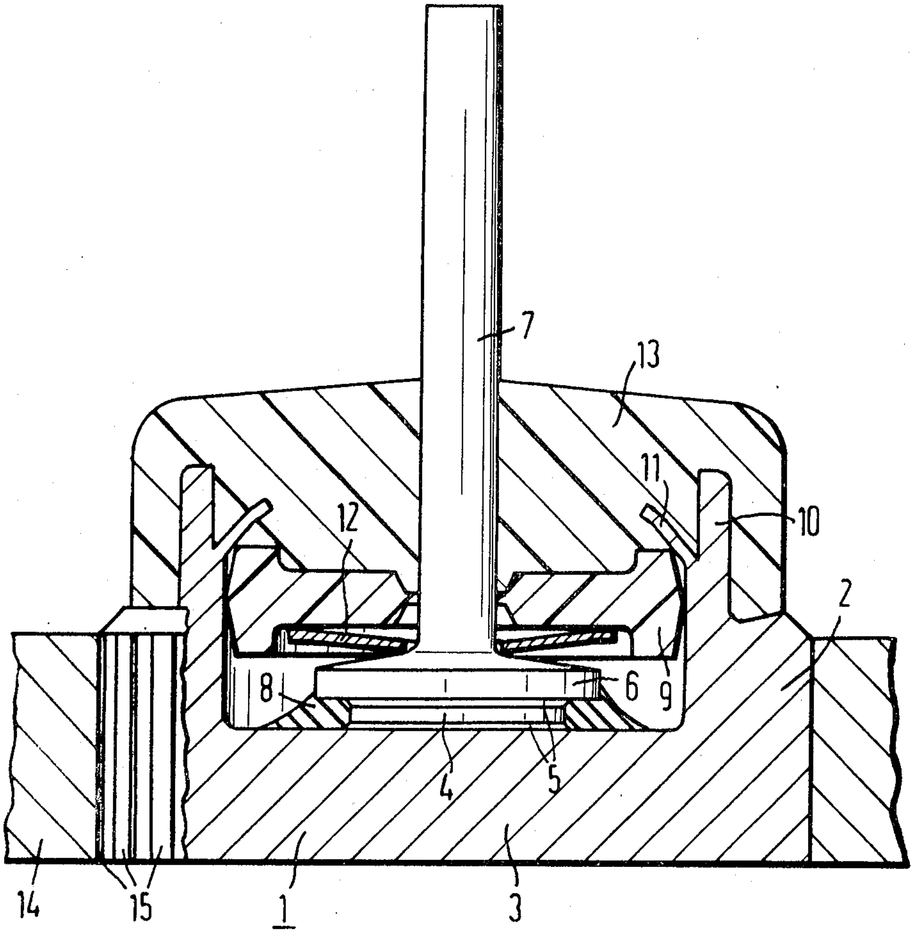

This is a continuation of application Ser. No. 66,746, filed Aug. 25, 1970, now abandoned.

DESCRIPTION OF THE INVENTION

The invention relates to a semiconductor component. More particularly, the invention relates to a semiconductor component which provides good heat conductivity without affecting synthetic material comprising a portion thereof.

The semiconductor component of the invention comprises a cup-shaped housing of good electrically and thermally conductive material such as, for example, metal. The housing encloses a semiconductor component in a gas-tight manner. The housing has a bottom, a side wall and a cover. A lead electrode extends through the cover and is electrically insulated therethrough, and an abutment inside the housing supports the cover. The housing is pressed into a recess of an assembly part to which heat is to be conducted from said housing.

A semiconductor component of the type of the invention is disclosed, for example, in DAS 1,197,552. In such semiconductor component, the cover which seals the housing is seated on a surface on the inside of the wall and is connected to the wall in a gas-tight manner by solder. The cover is a bushing in which the lead electrode extending into the housing is fitted in a gas-tight manner. The production of the semiconductor component is relatively cumbersome and expensive due to the required soldering process and the necessity for the bushing which usually consists of pressed glass.

U.S. Pat. No. 2,006,932 discloses a semiconductor component wherein a semiconductor body is enclosed in a gas-tight manner in a cup-shaped housing by the expedient of completely filling the inside of the housing with synthetic material. The semiconductor body is wrapped in silicon rubber and the remaining interior of the housing is filled with an epoxide resin. The epoxide resin filling is a disadvantage, since it is incapable of sustaining or tolerating high temperatures. This limits the efficiency of the semiconductor component.

DAS 1,149,827 discloses a semiconductor component comprising a housing which is closed with a cover consisting of synthetic material. The cover is covered with a thin layer of synthetic material which seals the housing in a gas-tight manner. The semiconductor component is so constructed that a simple, but mechanically stable, relation or connection is provided between the cover, the cup-shaped housing and the lead electrode. The DAS does not mention at all the problem of operating the semiconductor component at relatively high temperatures. Furthermore, the major part of the heat produced by the semiconductor component is removed via the bottom of the housing. In a semiconductor component of the type of the invention, the heat produced by the semiconductor component is principally removed via the wall of the housing. The semiconductor component of DAS 1,149,827 is thus not readily applicable to fitted diodes.

It is possible to fill the entire housing with silicon rubber having a high heat resistance, to provide a pressed-in semiconductor component having a high load capacity. Such a semiconductor component is not suitable for mass production, however. Mass-produced semiconductor components must be available at low cost, and the high cost of silicon rubber makes the aforedescribed semiconductor component rather expensive.

The principal object of the invention is to provide a new and improved semiconductor component.

An object of the invention is to provide a semiconductor component providing good conductivity without affecting synthetic material.

An object of the invention is to provide a semiconductor component which is sealed by an inexpensive synthetic material, which synthetic material is not adversely effected by heat produced by the semiconductor component.

An object of the invention is to provide a semiconductor component utilizing an inexpensive synthetic material to seal the housing thereof, which semiconductor component may be operated at produced temperatures for exceeding the temperatures tolerated by the synthetic material without adversely affecting such synthetic material.

An object of the invention is to provide a semiconductor component which overcomes the disadvantages of the known similar types of semiconductor components.

An object of the invention is to provide a semiconductor component which is not cumbersome.

An object of the invention is to provide a semiconductor component which is inexpensive in manufacture.

An object of the invention is to provide a semiconductor component which operates at high temperature with efficiency, effectiveness and reliability.

An object of the invention is to provide a semiconductor component which conducts heat produced during operation via the side of the housing.

An object of the invention is to provide a semiconductor component which is suitable for mass production.

An object of the invention is to provide a semiconductor component which is applicable to fitted diodes.

In accordance with the invention, a semiconductor component comprises an assembly part of electrically and thermally conductive material having a recess. A cup-shaped housing of electrically and thermally conductive material encloses a semi-conductor body in a gas-tight manner. The housing has a bottom, a side wall and a cover. The cover has a surface farther from the semiconductor body and the side wall has an outer height dimension which permits the housing to be pressed into the recess in the assembly part. Abutting means in the housing supports the cover in a manner whereby the surface of the cover farther from the semiconductor body is at least as high as the outer height dimension of the side wall of the housing. A lead electrode extends through the cover of the housing in electrically insulated relation. Synthetic material covers the cover of the housing in a gas-tight manner.

The synthetic material comprises an epoxide resin. The cover of the housing comprises electrically insulating synthetic material.

Clamping members extend from the inside of the side wall of the housing and clamp the cover of the housing tight on its seat. The cover of the housing has a configuration which presses the lead electrode on the semiconductor body under the clamping effect of the clamping members.

A spring may be provided between the cover of the housing and the lead electrode. A pressure member may be provided between the lead electrode and the spring. The pressure member has a configuration adjusted to that of the lead electrode and that of the spring and insulates the spring from the housing.

The cover of the housing is fitted in the side wall of the housing in a manner which seals the inside of the housing from the synthetic material. The cover of the housing has a surface closer to the semiconductor body having a configuration which centers the spring. The cover of the housing may function as the pressure member.

On occasion, it has been found favorable to press the lead electrode, the semiconductor body and the bottom of the housing on each other in the finished housing. This serves to stabilize the solder layers between the semiconductor body and the lead electrode, on the one end, and between the semiconductor body and the bottom of the housing, on the other hand.

The cover of the housing may be designed so that after it is clamped tight, it presses the lead electrode on the semiconductor body.

Figure 2:
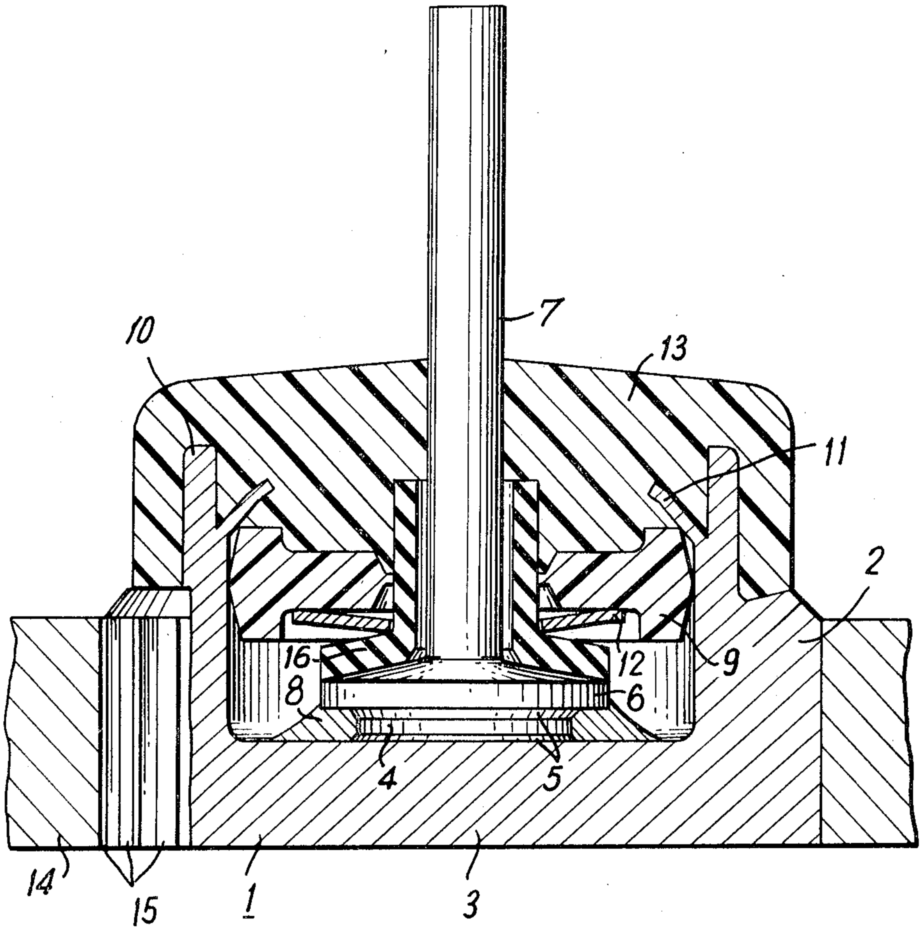

In order that the invention may be readily carried into effect, it will now be described with reference to the accompanying drawing, wherein:

FIG. 1 is a view, partly in section, of an embodiment of the semiconductor component of the invention; and FIG. 2 is a view, partly in section, of a modification of the embodiment of FIG. 1

In the FIGS., the same components are identified by the same reference numerals.

In FIG. 1, a housing 1 comprises a side wall 2 and a bottom 3. The side wall 2 and the bottom 3 of the housing 1 comprise material having good thermal and electrical conductivity. A semiconductor body 4 is mounted on the inside surface of the bottom 3 of the housing 1. The semiconductor body 4 is electrically and thermally connected to the bottom 3 and to a lead electrode 6 via solder layers 5 on both substantially planar surfaces of said semiconductor body.

A small amount of synthetic material 8 having high heat resistance surrounds the semiconductor body 4. The synthetic material 8 may comprise, for example, silicon rubber, and functions to protect the pn junction of the semiconductor body 4, during the time that the housing remains unsealed. This is necessary because the pn junction of the semiconductor body is especially sensitive to moisture.

A spring 12 rests on the upper part of the contact portion of the lead electrode 6, in the housing. A cover 9 for the housing rests on the spring 12. The cover 9 comprises thermally and electrically insulating material. The cover 9 may comprise a synthetic material. The cover 9 is clamped tight in the interior of the housing 1 by clamping members 11. The clamping members 11 extend from the inside of the side wall 2 of the housing 1 and clamp the cover 9 of said housing on its seat. The clamping members 11 may be pried from the inside of a portion 10 of the side wall 2 of the housing 1.

A cover 13 of synthetic material closes the housing 1 in a gas-tight manner against the outside atmosphere. A lead portion 7 of the lead electrode 6 extends through the cover 9 of the housing 1 and the synthetic layer 13. The synthetic material of the layer 13 may comprise an epoxide resin, for example. The cover 9 is fitted into the inside of the housing 1 in a manner whereby the synthetic material cannot penetrate into the inside of said housing.

During operation, the semiconductor component of the invention is pressed into a recess of an assembly part 14. To facilitate this, the outside peripheral surface of the side wall 2 of the housing 1 is provided with projections or elevations 15 which are edged during the pressing of the semiconductor component into the recess of the assembly part 14. This provides, via force-locking, an excellent thermal and electrical connection between the semiconductor component and the assembly part 14.

In accordance with the invention, the cover 9 of the housing 1 is supported in a manner whereby the upper surface of said cover is higher than the upper boundary of the side wall 2 to which a force-locking connection with the assembly part 14 is permissible. Consequently, the heat produced during the operation of the semiconductor component is principally transferred by heat conductance to the assembly part 14, via the side wall 2 of the housing 1 of said semiconductor component. The heat conducted to the layer 13 of the synthetic material and to the cover 9 of synthetic material is relatively low, so that said layer and said cover may comprise relatively inexpensive synthetic material such as, for example, an epoxide resin.

Clamping members 11 function as anchors for the layer 13 of synthetic material, so that said layer of synthetic material cannot loosen with regard to the side wall 2 of the housing 1. The clamping members 11 also cause the lead electrode 6 to exert a specific pressure on the solder layers 5. As a result, the solder layers 5 have a long life span, regardless of frequent load fluctuations and different coefficients of expansion of the lead electrode 6 and the semiconductor body 4 and said semiconductor body and the bottom 3 of the housing 1.

The cover 9 of the housing 1 may have a depression or indentation formed on the surface thereof closer to the semiconductor body 4. The depression or indentation functions to center the spring 12. The cover 9 simultaneously functions to insulate the spring 12 from the side wall 2 of the housing 1.

In the modification of FIG. 2, a pressure member 16 is provided between the lead electrode 6 and the spring 12. The pressure member 16 has a configuration adjusted to that of the lead electrode 6 and that of the spring 12 and insulates said spring from the housing 1.

While the invention has been described by means of a specific example and in a specific embodiment, we do not wish to be limited thereto, for obvious modifications will occur to those skilled in the art without departing from the spirit and scope of the invention.

We claim:

1. A semiconductor component, comprising a semiconductor body; a cup-shaped member enclosing said semiconductor body, said cup-shaped member having a bottom wall, a side wall integral therewith, and an open top, said walls of said cup-shaped member being formed of electrically and thermally conductive material, said semiconductor body being mounted in said cup-shaped member and in conductive contact therewith, a cover member formed of electrically insulating synthetic material, said cover member being mounted on said open top of said cup-shaped member and having a surface facing away from said semiconductor body, said side wall having at least part of the outer height thereof of such construction as to permit said cup-shaped member to be pressed into a recess formed in an assembly part, clamping means extending from the inside of said side wall and clamping said cover member to said cup-shaped member in a gas-tight manner; abutting means in said cup-shaped member supporting said cover member in a manner whereby the surface of said cover member facing away from said semiconductor body is at least as high as said part of the outer height of the side wall of said cup-shaped member; a lead electrode extending through said cover member in electrically insulated relation, said lead electrode having a head thereon, a spring between said cover member and the head of said lead electrode; and synthetic material covering said cover member in a gas-tight manner.

* * * * *